US005779927A

United States Patent [19]

Lo

[11] Patent Number: 5,779,927
[45] Date of Patent: Jul. 14, 1998

[54] MODIFIED REFLUX ETCHER CONTROLLED BY PH OR CONDUCTIVITY SENSING LOOP

[75] Inventor: Chi-Hsin Lo, Pin-Jan, Taiwan

[73] Assignee: Taiwan Semiconductor Manufacturing Company, Ltd., Hsin-Chu, Taiwan

[21] Appl. No.: 789,723

[22] Filed: Jan. 27, 1997

[51] Int. Cl.[6] .......................... H01L 21/00; C03C 25/06
[52] U.S. Cl. .......................... 216/84; 156/345; 438/5
[58] Field of Search .......................... 216/84; 156/345; 438/5

[56] References Cited

U.S. PATENT DOCUMENTS 5,188,701  2/1993  Hirano .......................... 156/626
5,268,642  12/1993  Uchidomi .......................... 324/445

FOREIGN PATENT DOCUMENTS 0 262 616  4/1988  European Pat. Off. .

OTHER PUBLICATIONS

DJ. Elliott,"Integrated Circuit Fabrication Technology" McGraw Hill New York. 1982 pp. 257-259.
S.Wolf et al. "Silicon Processing for the VLSI Era" vol. 1, p. 534. Lattice Press, Sunset Beach, CA. 1986.

Primary Examiner—Michael P. Woodward
Assistant Examiner—Brenda G. Brumback
Attorney, Agent, or Firm—George O. Saile; Stephen B. Ackerman

[57] ABSTRACT

Apparatus and method are described for etching in liquid acids at high temperatures. notably silicon nitride in phosphoric acid. This has been achieved by providing an apparatus in which the liquid acid evaporant is condensed and returned to the main volume of acid by way of a pH meter whose output is used to control the flow of additional pure water into the main system. Alternatively, a conductivity meter, located in the etch bath, may be used for the same purpose. Undiluted acid is automatically added to the main system, as needed, under the control of a level sensor that senses the quantity of liquid in the main volume. Thus the pH or conductivity of the etchant is constantly being monitored and maintained at the desired level. Since the aqueous concentration remains steady throughout, sudden unexpected, and potentially dangerous, increases in the rate of boiling do not occur.

13 Claims, 4 Drawing Sheets

MODIFIED REFLUX ETCHER CONTROLLED BY PH OR CONDUCTIVITY SENSING LOOP

BACKGROUND OF THE INVENTION (1) Field of the Invention

The invention relates to wet etching at high temperatures, more particularly to the etching of silicon nitride in phosphoric acid.

(2) Description of the Prior Art

In the course of manufacturing semiconductor integrated circuits it is necessary to provide areas of thick insulation for the purpose of electrically isolating various components and circuits from one another. In silicon based circuits the preferred thick insulation is silicon dioxide (known as field oxide or FOX).

In general, FOX layers are over a micron in thickness and are formed in selected areas on the silicon surface. Silicon nitride is useful as the masking layer for selective oxidation of this type as it is not readily penetrated by oxygen and is also resistant to conversion to silicon oxide.

Starting with FIG. 1a, we illustrate in a schematic manner how FOX is formed. Silicon nitride mask 1 sits on thin layer of pad oxide 2 (used to get stress relief) which covers the surface of silicon substrate 3. As seen in FIG. 1b, after subjection to oxidizing conditions (e.g. high temperature steam for several hours) thick oxide layer 4 has grown everywhere except where masked by silicon nitride 1.

Once the FOX has been grown to the desired thickness the silicon nitride mask needs to be removed so that the structure will have the appearance shown in FIG. 1c. This is accomplished using phosphoric acid which is known to etch silicon nitride at a rate that is several hundred times faster than the rate at which it etches silicon oxide. Typically, etching takes about an hour in 85% phosphoric acid at temperatures approaching 180° C.

Because of the high temperatures needed to etch effectively with phosphoric acid (boiling point about 200° C.), etchers in the prior art have typically been of the open ended type wherein the acid bearing container is made gas-tight and is connected to an exhaust system where evaporant from the system is collected but not returned to the source. For example, D. J. Elliott, "Integrated Circuit Fabrication Technology" McGraw Hill New York 1982 pp. 257–259, shows wet etch stations of this type. The use of reflux boiling for silicon nitride etching in 85% phosphoric acid is mentioned by S. Wolf and R. Tauber in "Silicon processing for the VLSI era" vol. 1 p. 534, Lattice Press 1986. In this context, reflux boiling would normally mean condensing the evaporant and allowing the condensate to return directly to the source.

While silicon nitride can be effectively etched in a simple open ended system, such a simple system is unsuitable in a manufacturing environment because no control is exercised over etch rate. As evaporant is lost from the system and as acid is consumed through reaction with the material being etched, etch rate keeps changing.

To deal with the etch rate control problem we had previously been using an etcher of the type shown in FIG. 2. The material to be etched (shown schematically as silicon nitride layer 12) is immersed in the phosphoric acid liquid etchant 11 which is contained in gas-tight container 13. The other end of container 13 is connected to an exhaust system so that any evaporant coming from acid 11 is carried away in direction 14. A heater (not shown) is used to heat and maintain the temperature of 11 around 165° C.

As phosphoric acid is consumed through reaction with silicon nitride layer 12, it needs to be replenished, along with about 15% water so that its concentration remains essentially constant. This is accomplished by allowing deionized water, held in source 15 to be admitted at a steady rate into 13 by way of piping 17. Flow valve 16, through which the water flows is not adjusted during system operation. Simultaneously, some pure phosphoric acid is admitted from source 18 through flow valve 19 into buffer tank 20 which surrounds 13. Liquid also enters buffer tank 20 whenever the volume of liquid in the tank gets too great so that liquid surface 21 overflows into 20. Level 22 of liquid in buffer tank 20 is monitored by level sensor 23 (shown schematically as a series of Xs) and the output of 22 is used to control flow valve 19 (which determines the rate at which fresh phosphoric acid enters the system). Thus, if too much phosphoric acid is being added to the system, more overflow occurs and the flow of fresh acid is reduced. When the liquid level in 20 gets too low the signal from level sensor 23 calls for an increase in the flow of fresh acid.

Also shown in FIG. 2 is filter 24 and heater 25 through which the fresh acid and deionized water must pass before they can be readmitted to container 13.

This system suffers from a number of limitations. First, it is wasteful as any phosphoric that evaporates during the process is removed by the exhaust system. Secondly, since the flow of deionized water into the system is constant while the flow of rag fresh phosphoric acid keeps changing, the net concentration of the newly added phosphoric acid also keeps on changing. This means that the etch rate keeps on changing, too. Also, since the rate at which the acid boils varies with its concentration, with more dilute acid boiling more readily, unacceptably high boiling rates can occur from time to time (as excess water is admitted), introducing a safety issue and placing a higher than intended load on the heater.

SUMMARY OF THE INVENTION

It has been an object of the present invention to provide an apparatus and method for liquid acid etching at high temperatures.

Another object of the present invention is that little or none of the liquid acid be lost during the process, other than what is consumed by the etching itself.

Yet another object is that said process be stable so that the optimum conditions for etching, once determined, can be reliably maintained.

A still further object is that the system should be safe and that sudden violent increases in the boiling rate should not occur.

These objects have been achieved by providing an apparatus in which the liquid acid evaporant is condensed and returned to the main volume of acid by way of a pH meter whose output is used to control the flow of additional pure water into the main system. Alternatively, a conductivity meter, located in the etch bath, may be used for the same purpose. Undiluted acid is automatically added to the main volume, as needed, under the control of a level sensor that senses the quantity of liquid in the main volume. Thus the pH or conductivity of the etchant is constantly being monitored and maintained at the desired level. Since the aqueous concentration remains steady throughout, sudden unexpected, and potentially dangerous, increases in the rate of boiling do not occur.

DESCRIPTION OF THE PREFERRED EMBODIMENTS

Figure 1A:
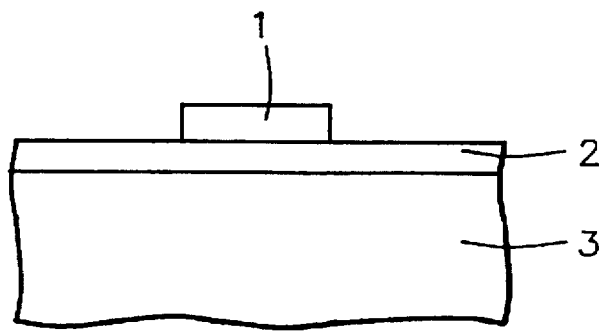
FIGS. 1a–c illustrate the use of silicon nitride as a mask during the growth of field oxide.
Figure 1B:
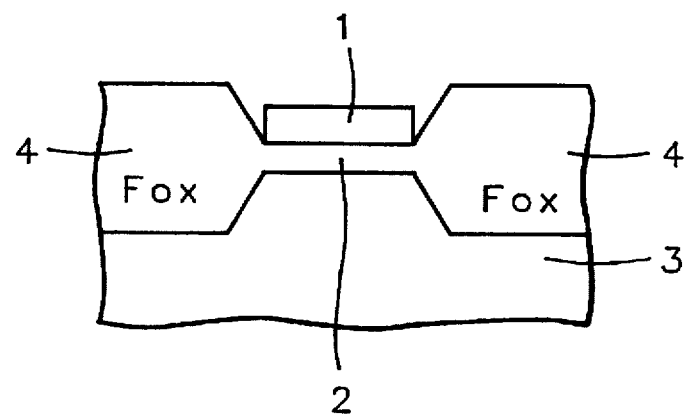
Figure 1C:
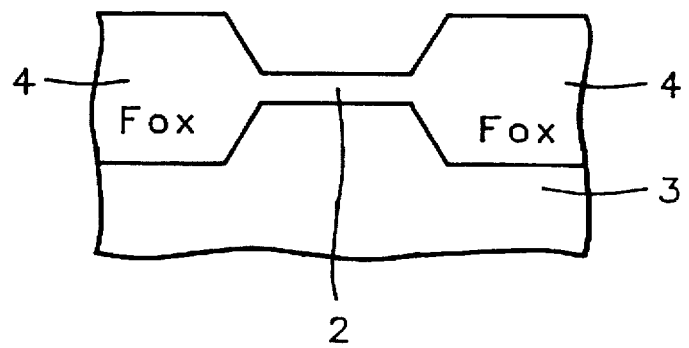
Figure 2:
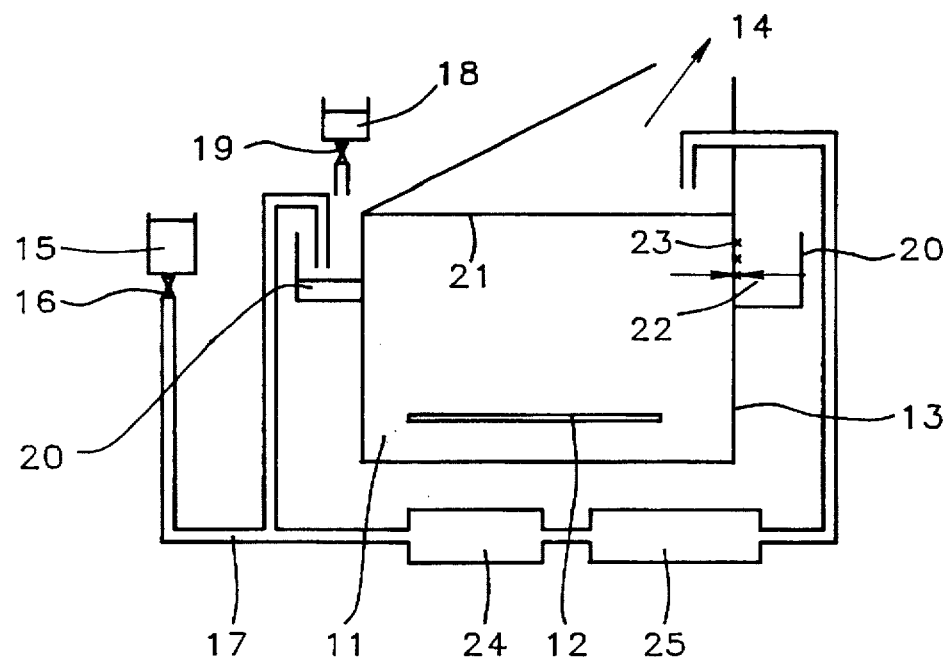
FIG. 2 shows the etching apparatus previously used by the inventor for etching silicon nitride in phosphoric acid.
Figure 3:
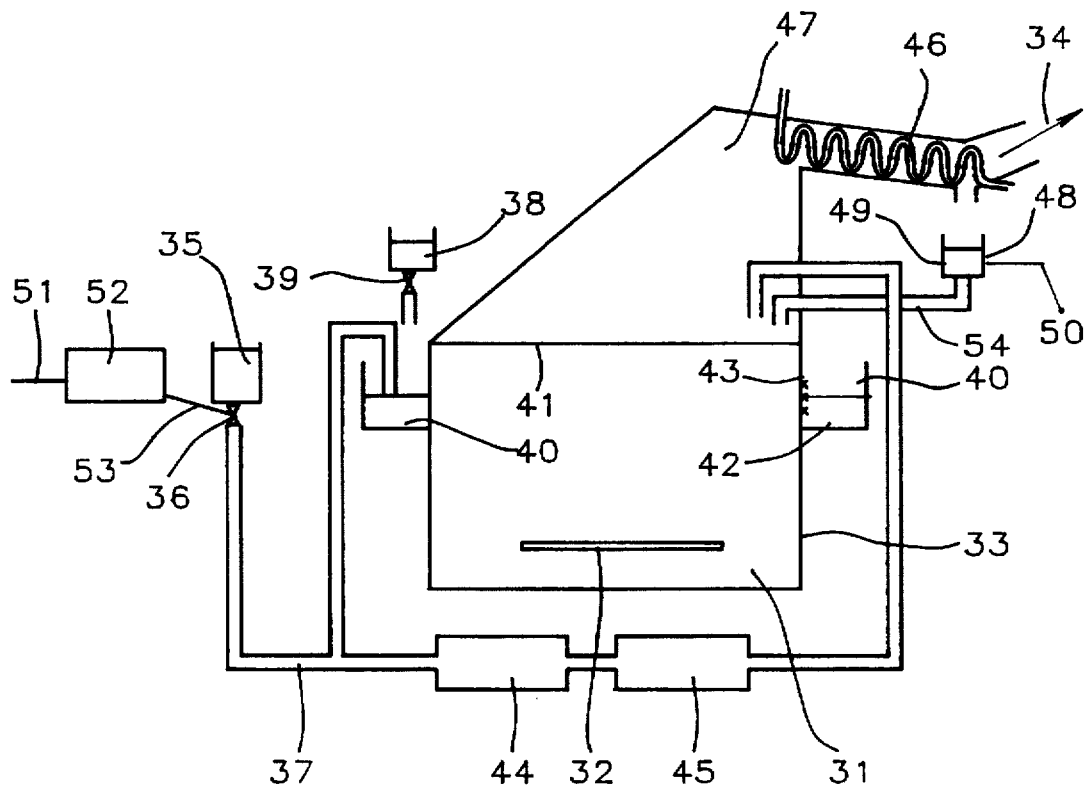
FIG. 3 illustrates a first embodiment of the apparatus of the present invention.

Referring now to FIG. 3, the present invention can be seen to differ from the system shown in FIG. 2 in several important ways. The material to be etched (shown schematically as layer 32), for example silicon nitride, is immersed in acidic liquid etchant 31, for example phosphoric acid, which is contained in gas-tight container 33 and has a concentration between about 75 and 95%. Top end 47 of container 33 is connected to an exhaust system so that any evaporant coming from acid 31 is pulled in direction 34. Before the evaporant can leave the system it has to pass over a set of condenser coils 46. The condensate, as it drips off the condenser coils, either returns directly to 31 (conventional reflux action) or flows down the sloping far end of 47 and passes through reservoir 48, which includes pH meter 49, on its way back into 31 (modified reflux action) by way of piping 54. Output 50 of pH meter 49 is connected to input 51 of Proportional Integrated Derivative (PID) controller 52. Output 53 of the PID Controller is proportional to the difference between the actual pH measured and some preset target value (between about 2.3 and 6.0 in both cases), so that situations in which the composition of the evaporant is beginning to change can be anticipated in plenty of time for corrective action to be taken. Said corrective action takes the form of adjusting the rate of flow through electrically controllable flow valve 36 which controls the addition of pure water 35 to the system. In general the total level of impurities in water 35 is less than about 0.1 ppm. and it will also have been deionized. This is an important departure from the method and apparatus seen in FIG. 2 where the flow of pure water into the system was steady throughout its operation. A primary heater (not shown) is used to heat and maintain the temperature of 31 in the range of from about 155° to 185° C.

Replenishment of phosphoric acid (consumed through reaction with silicon nitride layer 32) is accomplished in essentially the same way as in our earlier system (FIG. 2). Pure phosphoric acid is admitted from source 38 through flow valve 39 into buffer tank 40 which surrounds 33. Liquid also enters buffer tank 40 whenever the volume of liquid in the tank gets too great so that liquid surface 41 overflows into 40. Level 42 of liquid in buffer tank 40 is monitored by level sensor 43 (shown schematically as a series of Xs) and the output of 43 (not explicitly shown) is used to control flow valve 39, thereby determining the rate at which fresh phosphoric acid enters the system. Thus, if too much liquid is being added to the system, more overflow occurs and the flow of fresh acid is reduced. When the liquid level in 40 gets too low the signal from level sensor 43 calls for an increase in the flow of fresh acid.

Also shown in FIG. 3 is filter 44 and heater 45 through which the fresh acid and added water must pass before they can be readmitted to container 33.

Figure 4:
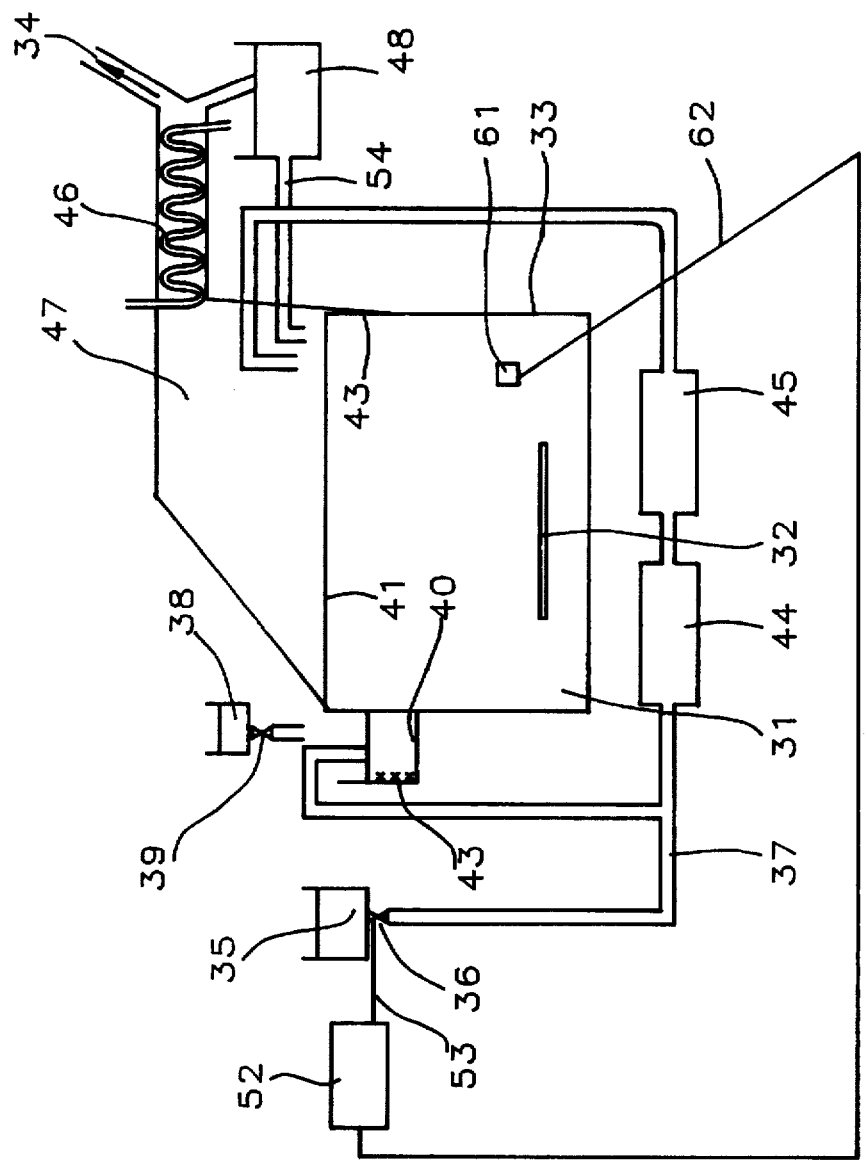
FIG. 4 illustrates a second embodiment of the apparatus of the present invention.

In FIG. 4 we show a second embodiment of the invention. It is generally similar to the apparatus shown in FIG. 3 except that the pH of condensate 48, off cooling coils 46, is no longer actively monitored. Instead, conductivity cell 61, of conventional design and readily available commercially, is permanently situated in etchant 31 and its output is connected (via line 62) to PID 52 which controls flow through valve 36, as before, thereby controlling the rate at which fresh deionized water is added to the system.

Also as before, replenishment of phosphoric acid (consumed through reaction with silicon nitride layer 32) is accomplished in essentially the same way as in our earlier system (FIG. 2). Pure phosphoric acid is admitted from source 38 through flow valve 39 into buffer tank 40 which surrounds 33. Liquid also enters buffer tank 40 whenever the volume of liquid in the tank gets too great so that liquid surface 41 overflows into 40. Level 42 of liquid in buffer tank 40 is monitored by level sensor 43 (shown schematically as a series of Xs) and the output of 43 (not explicitly shown) is used to control flow valve 39, thereby determining the rate at which fresh phosphoric acid enters the system. Thus, if too much liquid is being added to the system, more overflow occurs and the flow of fresh acid is reduced. When the liquid level in 40 gets too low the signal from level sensor 43 calls for an increase in the flow of fresh acid.

The apparatus and method described relative to FIGS. 3 and 4 offer several advantages over that of FIG. 2:

The stripping rate for the material being etched (such as silicon nitride) can be reliably maximized and is very stable;

The optimum conditions for etching/stripping, once determined, can be reliably maintained;

very little acid is lost (other than in consuming the material being etched);

the problem of disposing of collected evaporant is essentially eliminated;

system safety is greatly improved since sudden violent increases in the boiling rate will no longer occur.

Figure 5:
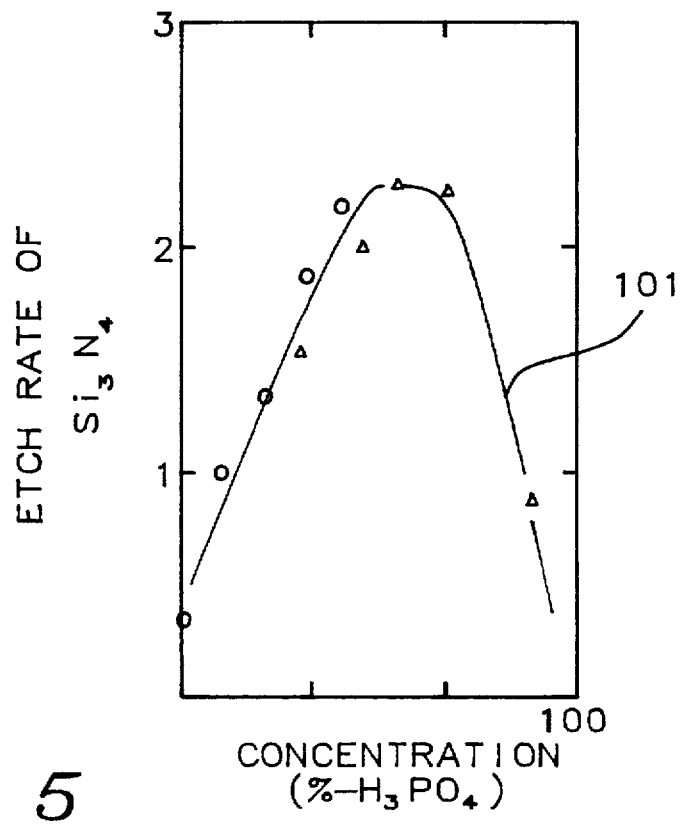
FIG. 5 is a curve of silicon nitride etch rate vs. phosphoric acid concentration.
Figure 6:
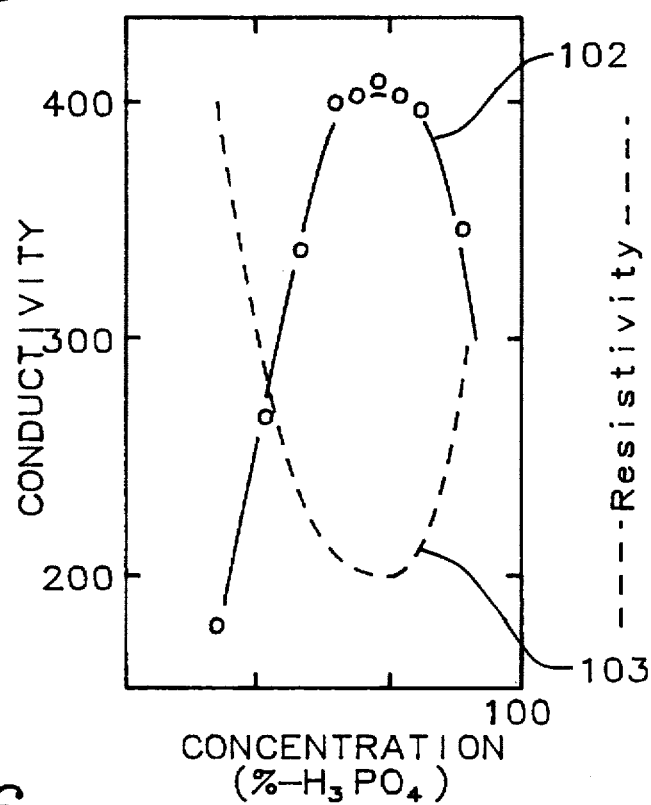
FIG. 6 is a curve of electrical conductivity of the etchant vs. phosphoric acid concentration.

Confirmation that the etch rate of silicon nitride is directly related to the phosphoric acid concentration is given in FIG. 5 (curve 101). The etch rate in arbitrary units has been plotted for a range of phosphoric acid concentrations between 0 and 95 weight %. All etching was performed at a temperature of 130° C. The relationship between electrical conductivity of the etchant and phosphoric acid concentration is shown in FIG. 6 (curve 102 shows conductivity in 1/ohm-cm. while curve 103 shows the corresponding curve for resistivity). As can be seen, the etch rate and conductivity curves are quite similar so that a plot of etch rate vs. conductivity is close to linear.

While the invention has been particularly shown and described with reference to the preferred embodiments thereof, using silicon nitride and phosphoric acid as illustrative examples, it will be understood by those skilled in the art that various changes in form and details may be made without departing from the spirit and scope of the invention.

What is claimed is:

1. Apparatus, for etching a substance, comprising:

a gas-tight container having first and second ends, the first end being suitable for holding a volume of an acidic liquid in which the substance is immersed and the second end, which includes internally located condenser coils, being connected to an exhaust system;

a primary heater, attached to the first end, for the purpose of heating said acidic liquid to a temperature near the liquid's boiling point, thereby generating an evaporant which can condense on said coils as a condensate having a pH value;

a reservoir for collecting said condensate;

a pH meter that measures said pH value and generates a first electrical signal that is proportional to said pH value;

a source of water connected to a first electrically controlled flow valve;

a source of the acidic liquid, undiluted, connected to a second electrically controlled flow valve;

a PID controller having an output and said first electrical signal as input;

a buffer tank into which the acidic liquid will flow, to some level, if said volume exceeds a preset value;

a level sensor that generates a second electrical signal whose value is proportional to said level;

piping whereby flow can occur from the water source, the buffer tank, and the reservoir into said first end;

an electrical connection between the PID controller output and said first electrically controlled flow valve; and an electrical connection between the second electrical signal and said second electrically controlled flow valve.

2. The apparatus of claim 1 wherein said acid is phosphoric acid and the substance is silicon nitride.

3. The apparatus of claim 1 wherein said temperature is between about 155° and 185° C.

4. The apparatus of claim 2 wherein the concentration of the phosphoric acid held in the first end is between about 80 and 95% and said pH value is between about 2.3 and 6.0.

5. A method for etching a substance comprising:

immersing the substance in a volume of diluted acidic liquid contained in gas-tight container;

heating the substance and the diluted acid to a preset temperature thereby forming evaporant;

condensing said evaporant, thereby forming a condensate, measuring a pH value for the condensate, generating a first electrical signal proportional to said pH value and allowing the condensate to return to the container;

connecting said first signal to a PID controller having an output that is proportional to the difference between a preset pH value and said measured pH value;

causing pure water to flow into the container under the control of said PID controller output;

providing a buffer tank into which the diluted acidic liquid flows, to some level, when said volume exceeds a preset value and generating a second electrical signal whose value is proportional to said level;

causing undiluted acidic liquid to flow into the buffer tank under the control of said second electrical signal; and causing liquid to flow from the buffer tank into the container.

6. The method of claim 5 wherein said acid is phosphoric acid and the substance is silicon nitride.

7. The method of claim 5 wherein said temperature is between about 155° and 185° C.

8. The method of claim 6 wherein the concentration of the diluted phosphoric acid is between about 80 and 95%.

9. The method of claim 5 wherein the measured pH value and the preset pH value are between about 2.3 and 6.0.

10. A method for etching a substance comprising:

immersing the substance in a volume of phosphoric acid whose concentration is between about 80 and 95%, contained in a gas-tight container;

heating the substance and the phosphoric acid to a preset temperature, between about 155° and 185°C., thereby forming an evaporant;

condensing said evaporant, thereby forming a condensate that is allowed to return to the container;

measuring the electrical conductivity of the liquid in the container thereby generating a first electrical signal;

connecting said first signal to a PID controller having an output that is linearly proportional to the difference between a preset conductivity value and said measured conductivity value;

causing pure water to flow into the container under the control of said PID controller output;

providing a buffer tank into which the diluted phosphoric acid flows, to some level, when said volume exceeds a preset value and generating a second electrical signal whose value is proportional to said level;

causing undiluted phosphoric acid to flow into the buffer tank under the control of said second electrical signal; and causing liquid to flow from the buffer tank into the container.

11. The method of claim 10 wherein said substance is silicon nitride.

12. The method of claim 10 wherein said measured conductivity value is between 0 and about 1,000 mho/cm.

13. The method of claim 10 wherein the preset conductivity value is between about 300 and 700 mho/cm.

* * * * *